United States Patent
Park

(10) Patent No.: US 7,802,154 B2
(45) Date of Patent: Sep. 21, 2010

(54) METHOD AND APPARATUS FOR GENERATING HIGH-FREQUENCY COMMAND AND ADDRESS SIGNALS FOR HIGH-SPEED SEMICONDUCTOR MEMORY DEVICE TESTING

(75) Inventor: Hwan-wook Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 392 days.

(21) Appl. No.: 11/928,019

(22) Filed: Oct. 30, 2007

(65) Prior Publication Data
US 2008/0106957 A1 May 8, 2008

(30) Foreign Application Priority Data
Nov. 4, 2006 (KR) .................. 10-2006-0108636

(51) Int. Cl.
*G11C 29/00* (2006.01)

(52) U.S. Cl. .................. 714/718; 714/733; 714/724; 714/742; 714/744; 714/25; 714/42; 714/731; 365/201; 365/189.02; 365/230.02; 324/765

(58) Field of Classification Search .................. None
See application file for complete search history.

(56) References Cited

U.S. PATENT DOCUMENTS

| | | | | |
|---|---|---|---|---|
| 6,404,250 | B1 * | 6/2002 | Volrath et al. | 327/160 |
| 6,536,004 | B2 * | 3/2003 | Pierce et al. | 714/719 |
| 7,640,471 | B2 * | 12/2009 | Miao et al. | 714/724 |
| 2001/0040829 | A1 * | 11/2001 | Arimoto et al. | 365/189.02 |
| 2002/0042898 | A1 * | 4/2002 | Jones et al. | 714/744 |
| 2002/0171447 | A1 * | 11/2002 | Ernst et al. | 324/765 |
| 2002/0194546 | A1 * | 12/2002 | Ooishi | 714/42 |
| 2003/0191995 | A1 | 10/2003 | Abrosimov et al. | |
| 2004/0177302 | A1 * | 9/2004 | Mori et al. | 714/738 |
| 2006/0085706 | A1 * | 4/2006 | Gearhardt | 714/724 |
| 2006/0282735 | A1 * | 12/2006 | Weinraub et al. | 714/742 |
| 2007/0226567 | A1 * | 9/2007 | Gorman et al. | 714/733 |

FOREIGN PATENT DOCUMENTS

| | | |
|---|---|---|
| JP | 09043317 A | 1/1997 |
| KR | 1020050065689 A | 6/2005 |
| KR | 1020060044786 A | 5/2006 |

* cited by examiner

*Primary Examiner*—John P Trimmings
(74) *Attorney, Agent, or Firm*—Volentine & Whitt, PLLC

(57) ABSTRACT

A method and system for testing a semiconductor memory device using low-speed test equipment. The method includes providing a high-frequency test pattern by grouping a command signal and an address signal into command signal groups and address signal groups each corresponding to L cycles of a clock signal output from automatic test equipment (ATE) where L is a natural number. A valid command signal and a valid address signal, which are not in an idle state, are extracted from each of a plurality of command signal groups and each of a plurality of address signal groups. The valid command signal and the valid address signal are compressed into signals having a length corresponding to 1/M (M is a natural number larger than 1) of the cycle of the clock signal where M is a natural number larger than 1. A position designating signal indicating the positions of the valid command signal and the valid address signal in each command signal group and each address signal group is generated. A high-frequency command signal and a high-frequency address signal from the compressed valid command signal and the compressed valid address signal using the position designating signal are generated.

25 Claims, 12 Drawing Sheets

FIG. 7A

| PDS | Select CLK | Position |
|---|---|---|
| 0 | CLK2 | ■□ |
| 1 | /CLK2 | □■ |

FIG. 7B

| MUX | CMD | ADD |
|---|---|---|
| 0 | NOP | All Low |
| 1 | Pass | Pass |

FIG. 7C

|  | ACT | WR | RD | PRE | NOP |
|---|---|---|---|---|---|
| /CKE | L | L | L | L | L |
| /CS | L | L | L | L | H |
| /RAS | L | H | H | L | H |
| /CAS | H | L | L | H | H |
| /WE | H | L | H | L | H |

| | DATA PATTERN | SELECTING SIGNAL |
|---|---|---|
| FIRST DATA PATTERN GENERATOR | Vss (0000) | 000 |
| | Vdd (1111) | 001 |
| | CLK (1010) | 010 |
| | /CLK (0101) | 011 |
| SECOND DATA PATTERN GENERATOR |  | 100 |
| |  | 101 |
| |  | 110 |

METHOD AND APPARATUS FOR GENERATING HIGH-FREQUENCY COMMAND AND ADDRESS SIGNALS FOR HIGH-SPEED SEMICONDUCTOR MEMORY DEVICE TESTING

CROSS-REFERENCE TO RELATED APPLICATION

This U.S. non-provisional application claims priority under 35 U.S.C. 119 of Korean Patent Application No. 10-2006-0108636 filed on Nov. 4, 2006, the entire contents of which are hereby incorporated by reference.

BACKGROUND OF THE INVENTION

1. Field of the Invention

Embodiments of the invention relate to a semiconductor memory device and a test apparatus for testing the semiconductor memory device. More particularly, embodiments of the invention relate to a method and system for generating a high-frequency test pattern from a low-frequency test pattern output to perform high-speed test operations.

2. Discussion of Related Art

Semiconductor memory devices are tested using an external test apparatus. To test the memory cells of a semiconductor memory device, a method of recording a test pattern is recorded in a memory cell; the test pattern is read from the memory cell and compared. When the read test pattern is identical to the recorded test pattern, the semiconductor memory device is defect free. When the read test pattern is not identical to the recorded test pattern, the semiconductor memory device has a defect. Automatic test equipment (ATE) is generally used as the test apparatus.

However, operating frequencies of semiconductor memory devices are increasing and sometimes exceed the test pattern frequency generated by a test apparatus, thereby making the test apparatus ineffective. An additional drawback occurs when the maximum frequency that can be measured by a test apparatus is 200 MHz and the operating frequency of a semiconductor memory device that will be tested is 800 MHz rendering it impossible to correctly test whether the semiconductor memory device is defective. This problem is magnified in DDR (Double Data Rate), QDR (Quadrature Data Rate) and ODR (Octagon Data Rate) memory devices that transmit a larger quantity of data using a clock signal having the same frequency as that of the clock signal of conventional memory devices. Accordingly, there is a need for a test apparatus to accommodate memory devices operating at high frequencies.

SUMMARY OF THE INVENTION

Exemplary embodiments of the present invention are directed to a test apparatus for testing a semiconductor memory device. In an exemplary embodiment, the method and system generates a high-frequency command signal and a high-frequency address signal from a low-frequency command signal and a low-frequency address signal generated by a test apparatus to test high frequency memory devices. The method includes grouping a command signal into a command signal group and grouping an address signal into an address signal group. Each of the command signal and address signal correspond to L cycles of a clock signal output from automatic test equipment (ATE) where L is a natural number greater than 1. A valid command signal and a valid address signal, each of which are not in an idle state, are extracted from each of the command signal groups and each of the address signal groups. The valid command signal and the valid address signal are compressed into signals having a length corresponding to 1/M of the cycle of the clock signal where M is a natural number larger than 1. A position designating signal indicating the positions of the valid command signal and the valid address signal in each command signal group and each address signal group are generated. A high-frequency command signal from the compressed valid command signal and a high-frequency address signal from the compressed valid address signal are generated using the position designating signal.

BRIEF DESCRIPTION OF THE DRAWINGS

FIG. 7A is a table for explaining the output signal of a control signal generator illustrated in FIG. 6;

FIG. 7B is a table for explaining the output signal of a multiplexing unit illustrated in FIG. 6;

FIG. 7C is a table representing logic levels of command signals;

DESCRIPTION OF EMBODIMENTS

Figure 1:
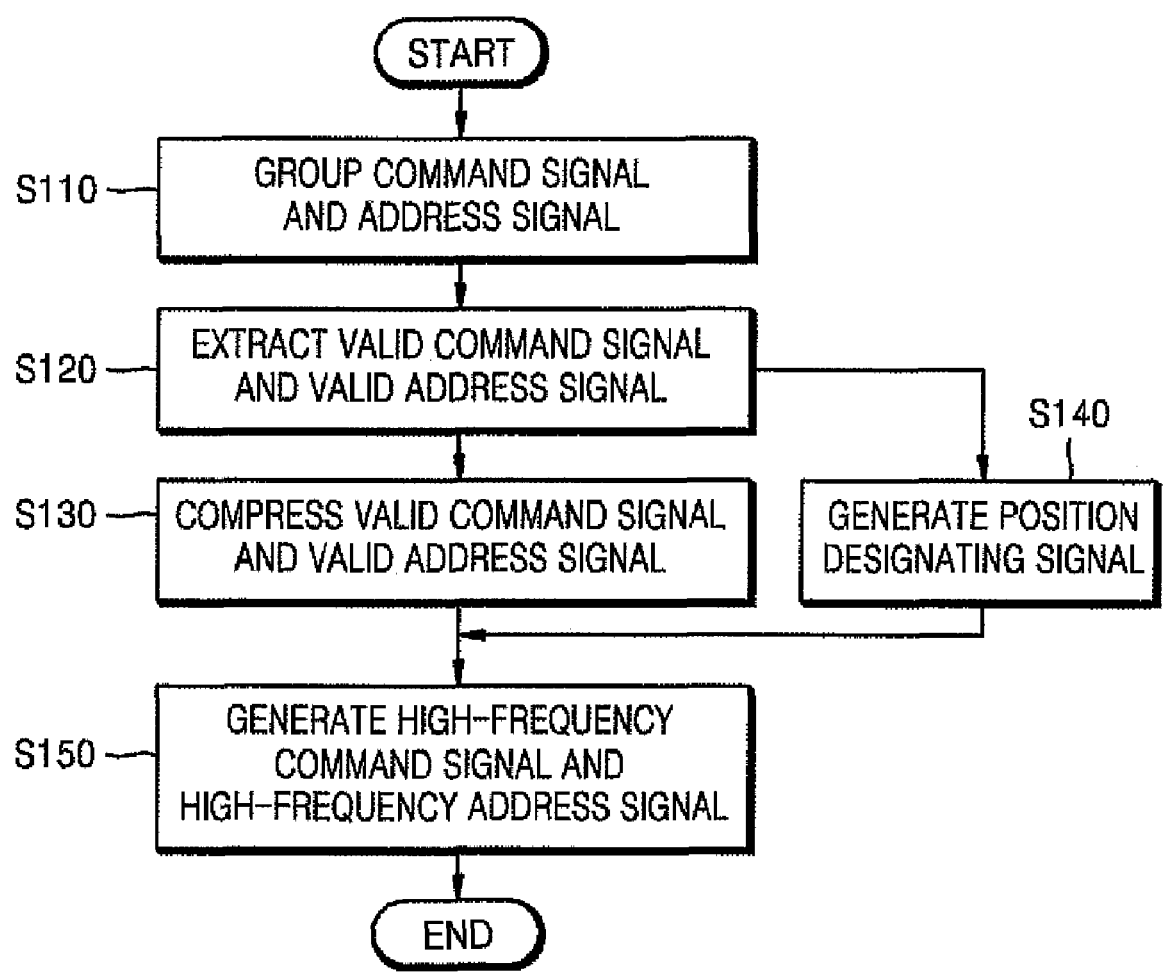
FIG. 1 is a flow chart of a method of generating a high-frequency command signal and a high-frequency address signal according to an embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a flow chart illustrating a command signal and an address signal grouped into command signal groups and address signal groups each corresponding to L (L is a natural number larger than 1) cycles of a clock signal to generate a plurality of command signal groups and a plurality of address signal groups in step S110. The clock signal is outputted from automatic test equipment (ATE) having a cycle of twice or four times a unit interval (UI) which is the minimum unit of an ATE signal. It is preferable to use a high-frequency command signal and a high-frequency address signal for DDR or ODR (Octagon Data Rate) memory devices. In step S120, a valid command signal and a valid address signal that are not in an idle state are respectively extracted from each command signal group and each address signal group. The idle state corresponds to a period during which a pulse signal is not input for a predetermined period of time. Each command signal group includes an idle period corresponding to at least one clock signal cycle.

The extracted valid command signal and the extracted valid address signal are compressed into signals having a length corresponding to 1/M (M is a natural number larger than 1) of the clock signal cycle in operation S130. Operations S110, S120 and S130 are carried out in the ATE and the compressed valid command signal and the compressed valid address signal have a length corresponding to a unit interval (UI). Accordingly, it is preferable that M is 2 when the clock signal has a cycle corresponding to two times the UI and M is 4 when the clock signal has a cycle corresponding to four times the UI.

Step S140 is executed in the ATE and a position designating signal of the valid command signal and the valid address signal in each command signal group and each address signal group is generated. When the grouping operation is performed for every two cycles of the clock signal, the position designating signal may be represented as a 1-bit logic signal. For example, the position designating signal can be represented as logic low "L" when the valid command signal exists in the first clock pulse of the clock signal. The position designating signal can be represented as logic high "H" when the valid command signal exists in the second clock pulse of the clock signal. If an invalid command signal and an invalid address signal are present, they are restored using the position designating signal to generate a high-frequency command signal and a high-frequency address signal from the compressed valid signal and the compressed valid address signal in step S150. The signal restoration operation from step S150 is carried out in the semiconductor memory device tested by the ATE. In this manner, idle periods are restored to the original positions using the position designating signal to convert a low-frequency command signal and a low-frequency address signal output from the ATE into a high-frequency command signal and a high-frequency address signal.

Figure 2A:
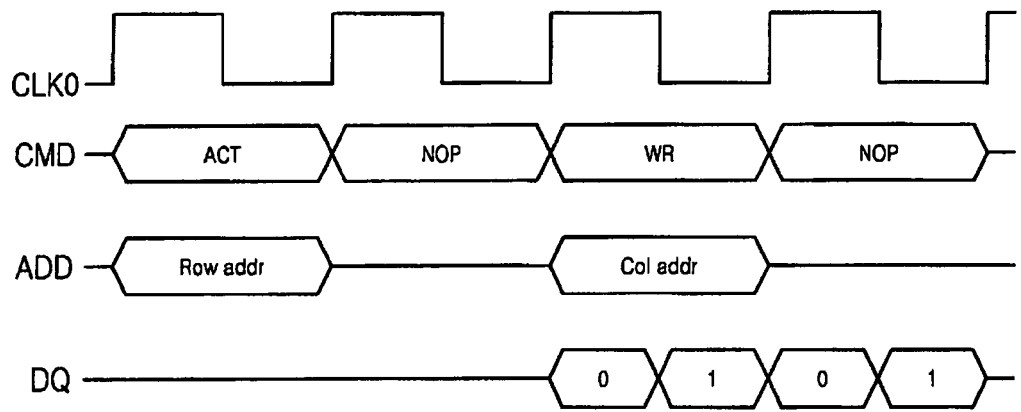
FIGS. 2A, 2B and 2C illustrate a method of generating a high-frequency command signal and a high-frequency address signal when data is input/output in a DDR (Double Date Rate) mode according to an embodiment of the present invention.

FIG. 2 illustrates a method of generating a high-frequency command signal and a high-frequency address signal when data is input/output in a DDR mode. FIG. 3 illustrates a method of generating a high-frequency command signal and a high-frequency address signal when data is input/output in a QDR mode. Referring to FIGS. 2(a) and 3(a), the method of generating a high-frequency command signal and a high-frequency address signal includes grouping a command signal CMD and an address signal ADD into command signal groups and address signal groups each corresponding to 2 cycles of a clock signal. Each command signal group and each address signal group respectively include at least one invalid command signal and at least one invalid address signal. Data signals DQ have burst lengths of 4 bits and 8 bits with the preferable burst length of input/output data being greater than 4 bits.

Figure 2B:
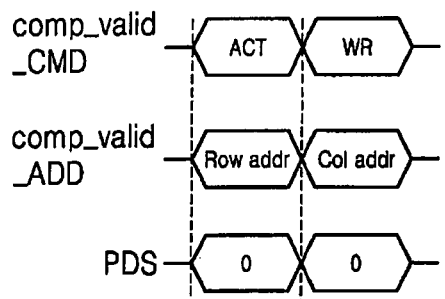
Figure 3A:
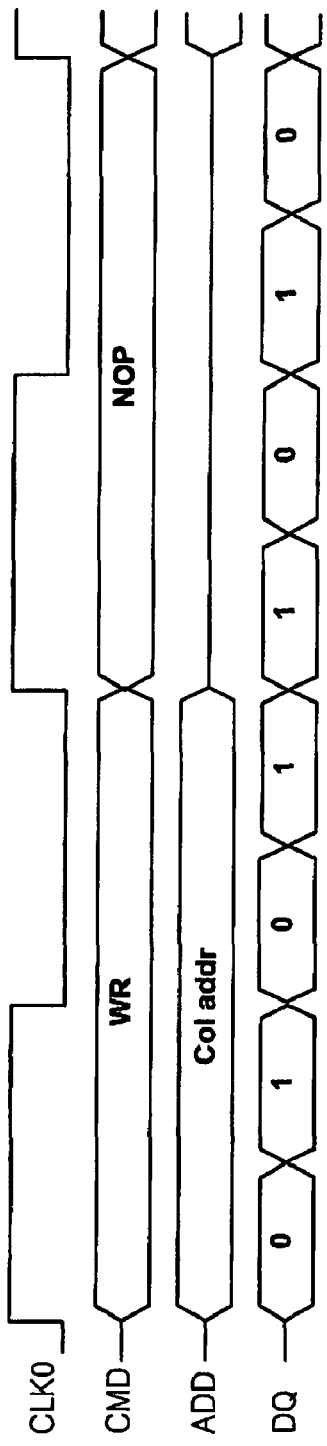
FIGS. 3A, 3B and 3C illustrate a method of generating a high-frequency command signal and a high-frequency address signal when data is input/output in a QDR (Quadrature Date Rate) mode according to an embodiment of the present invention.
Figure 3B:
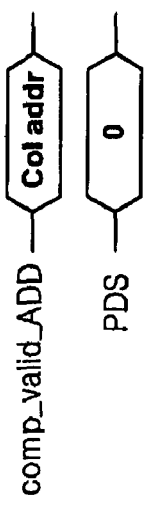

Referring to FIGS. 2(b) and 3(b), a valid command signal is extracted from each command signal group and a valid address signal is extracted from each address signal group. The extracted valid command signal and valid address signal are compressed to signals having a length corresponding to ½ or ¼ of the cycle of the clock signal to generate a compressed valid command signal comp_valid_CMD and a compressed valid address signal comp_valid_ADD. A position designating signal PDS is generated which indicates the positions of the valid command signal and the valid address signal in each command signal group and each address signal group. The position designating signal PDS has a value "0" or "1" based on the position of the valid command signal or the valid address signal in each command signal group or each address signal group. The valid command signal and the valid address signal exist in the same position in each command signal group and each address signal group. Thus, the position designating signal PDS can be generated based on any one of the valid command signal and the valid address signal. When only the valid command signal exists and the valid address signal does not exist in a specific group, the position designating signal PDS is generated based on the valid command signal. When both the valid command signal and the valid address signal do not exist in specific groups, the position designating signal PDS has a default value (for example, "0").

Figure 2C:
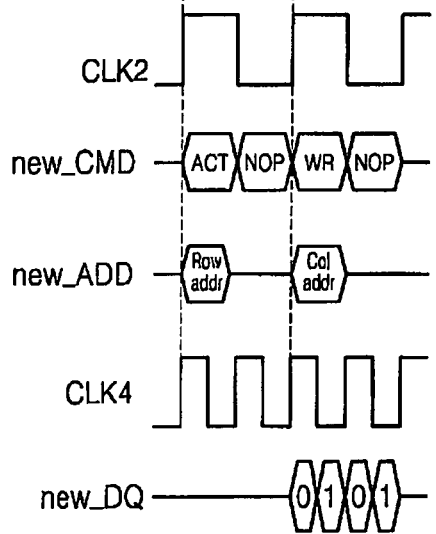
Figure 3C:
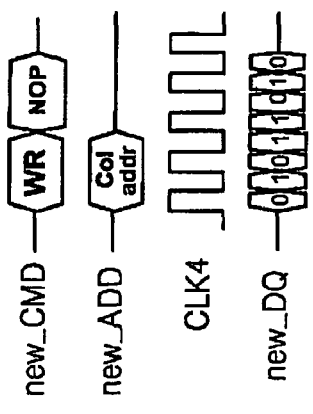

Referring to FIGS. 2(c) and 3(c), a high-frequency command signal new_CMD and a high-frequency address signal new_ADD are respectively generated based on the compressed valid command signal comp_valid_CMD and the compressed valid address signal comp_valid_ADD using the position designating signal PDS. Accordingly, a time required to test the semiconductor memory device can be reduced to ¼ of a cycle when the semiconductor memory device is DDR SDRAM and reduced further to ⅛ of a cycle when the semiconductor memory device is QDR SDRAM by using the present method of compressing the command signal and the address signal.

Figure 4:
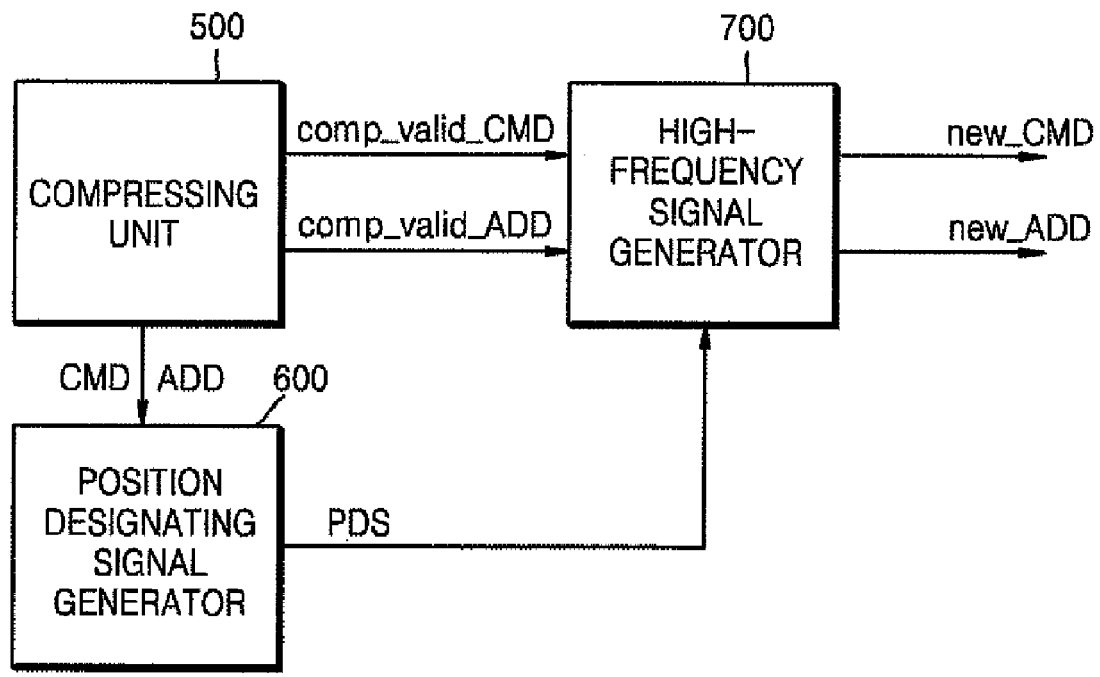
FIG. 4 is a block diagram of a system adapted to the method of generating a high-frequency command signal and a high-frequency address signal according to an embodiment of the present invention.

FIG. 4 is a block diagram of a system adapted to generate a high-frequency command signal and a high-frequency address signal including compressing unit 500, position designating signal generator 600, and high-frequency signal generator 700. Compressing unit 500 and position designating signal generator 600 may be located in the ATE and high-frequency signal generator 700 may be located in the semiconductor memory device. Compressing unit 500 groups a command signal CMD and an address signal ADD at predetermined intervals to generate a plurality of command signal groups and a plurality of address signal groups provided to position designating signal generator 600. Compressing unit 500 respectively extracts a valid command signal and a valid address signal from each command signal group and each address signal group and compresses the extracted valid command signal and the extracted valid address signal into signals having a predetermined length. For example, compression unit 500 may compress the extracted valid command signal and the extracted valid address signal into signals having a length corresponding to ½ or ¼ of the clock signal cycle. Position designating signal generator 600 receives the command signal groups and the address signal groups from compressing unit 500 and generates a position designating signal PDS indicating the positions of the valid command signal and the valid address signal in each command signal group and each address signal group.

High-frequency signal generator 700 generates a high-frequency command signal new_CMD and a high-frequency address signal new_ADD from the compressed valid command signal comp_valid_CMD and the compressed valid address signal comp_valid_ADD from compressing unit 500 using the position designating signal PDS. High-frequency command signal new_CMD includes an invalid command signal and the high-frequency address signal new_ADD includes an invalid address signal.

Figure 5:
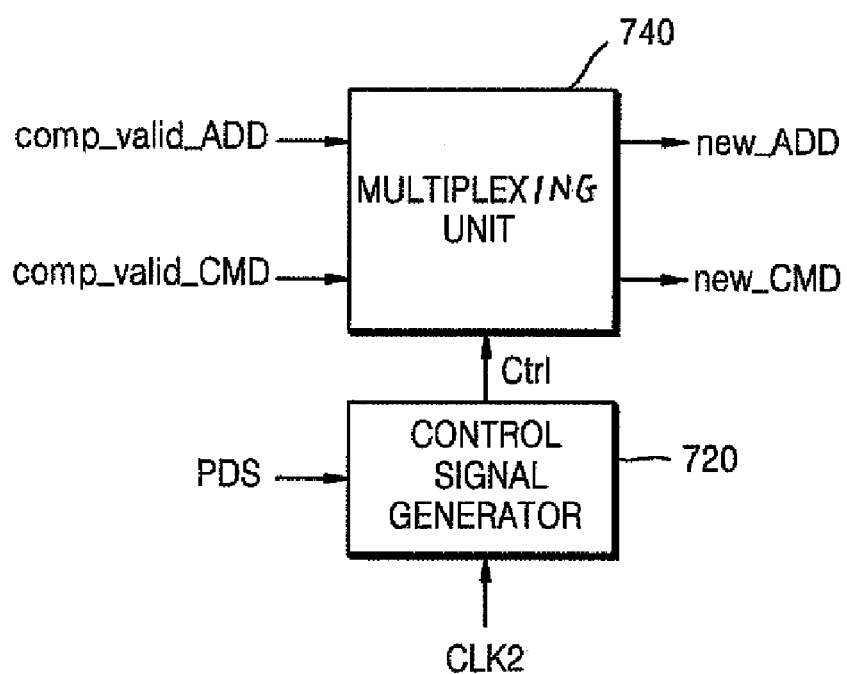
FIG. 5 is a block diagram of a high-frequency signal generator illustrated in FIG. 4.

FIG. 5 is a block diagram of high-frequency signal generator 700 illustrated in FIG. 4 including control signal generator 720 and multiplexing unit 740. Control signal generator 720 receives the position designating signal PDS and a first clock signal CLK2 and generates a control signal Ctrl. Multiplexing unit 740 is controlled by control signal Ctrl and receives the compressed valid command signal comp_valid_CMD and the compressed valid address signal comp_valid_ADD, and outputs high-frequency command signal new_CMD and high-frequency address signal new_ADD.

Figure 6:
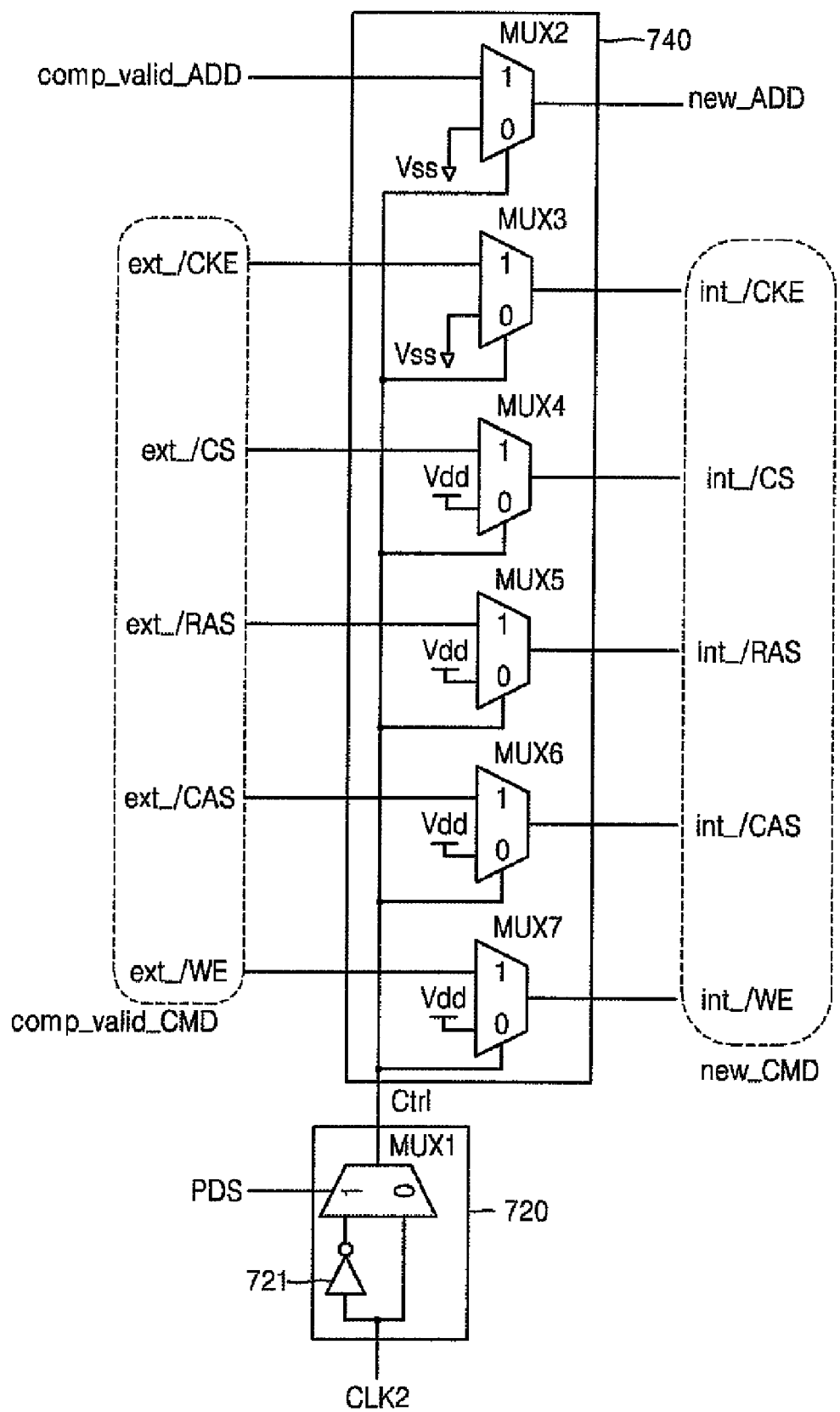
FIG. 6 illustrates a configuration of the high-frequency signal generator illustrated in FIG. 4.

FIG. 6 illustrates a configuration of high-frequency signal generator 700 illustrated in FIG. 4. FIG. 7A is a table explaining the output signal of control signal generator 720 illustrated in FIG. 6. FIG. 7B is a table explaining the output signal of multiplexing unit 740 illustrated in FIG. 6. FIG. 7C is a table representing logic levels of command signals. Control signal generator 720 includes an inverter 721 and a first multiplexer MUX1. First clock signal CLK2 is an input to control signal generator 720 and may be a high-frequency signal having a frequency of twice or four times the frequency of clock signal CLK. Multiplexer MUX1 receives the inverted clock signal /CLK2 from inverter 721 and first clock signal CLK2. The operation of first multiplexer MUX1 is controlled by position designating signal PDS. First multiplexer MUX1 outputs the inverted clock signal /CLK2 when the position designating signal PDS is logic high "H" and outputs first clock signal CLK2 when the position designating signal PDS is logic low "L". Accordingly, logic high "H" is output during the first half period of a cycle of the first clock signal CLK2 when position designating signal PDS is logic low "L" and logic high "H" is output during the second half period of the cycle of first clock signal CLK2 when the position designating signal PDS is logic high "H" as shown in FIG. 7A.

Multiplexing unit 740 includes a plurality of multiplexers MUX2-MUX 7. Multiplexing unit 740 receives the compressed valid address signal comp_valid_ADD and the compressed valid command signal comp_valid_CMD through first input terminals of the plurality of multiplexers MUX 2 through MUX7. Multiplexing unit 740 outputs high-frequency address signal new_ADD and high-frequency command signal new_CMD through output terminals of each of the plurality of multiplexers MUX2 through MUX7. Second input terminals of the plurality of multiplexers MUX4 through MUX 7 receive a power supply voltage Vdd. Second input terminals of multiplexers MUX2 and MUX 3 receive ground voltage Vss. In particular, multiplexer MUX2 receives the compressed valid address signal comp_valid_ADD via a first input terminal and ground voltage Vss via a second input terminal and outputs the high-frequency address signal new_ADD in response to control signal Ctrl. The first input terminals of multiplexers MUX3-MUX7 respectively receive control signals ext_/CKE, ext_/CS, ext_/RAS, ext_/CAS and ext_/we which together form the compressed valid command signal comp_valid_CMD. The second input terminal of multiplexer MUX3 receives ground voltage Vss and the second input terminals of multiplexers MUX4-MUX7 receive power supply voltage Vdd. Multiplexers MUX3 through MUX7 output the high-frequency command signal new_CMD in response to control signal Ctrl. Multiplexers MUX2 through MUX7 output the high-frequency address signal new_ADD and the high-frequency command signal new_CMD based on control signal Ctrl. In particular, multiplexer MUX2 through MUX7 pass the signals received at respective first input terminals when control signal Ctrl is logic high "H" and output the power supply voltage Vdd or ground voltage Vss applied to their second input terminals when control signal Ctrl is logic low "L" as illustrated in FIG. 7B. FIG. 7C illustrates a truth table with command signal ACT_CMD for activating a word line, command signal WR_CMD for instructing data to be written, command signal RD_CMD for instructing data to be read, command signal PRE_CMD for precharging a bit line voltage, and an invalid command signal NOP representing an idle state.

Figure 8:
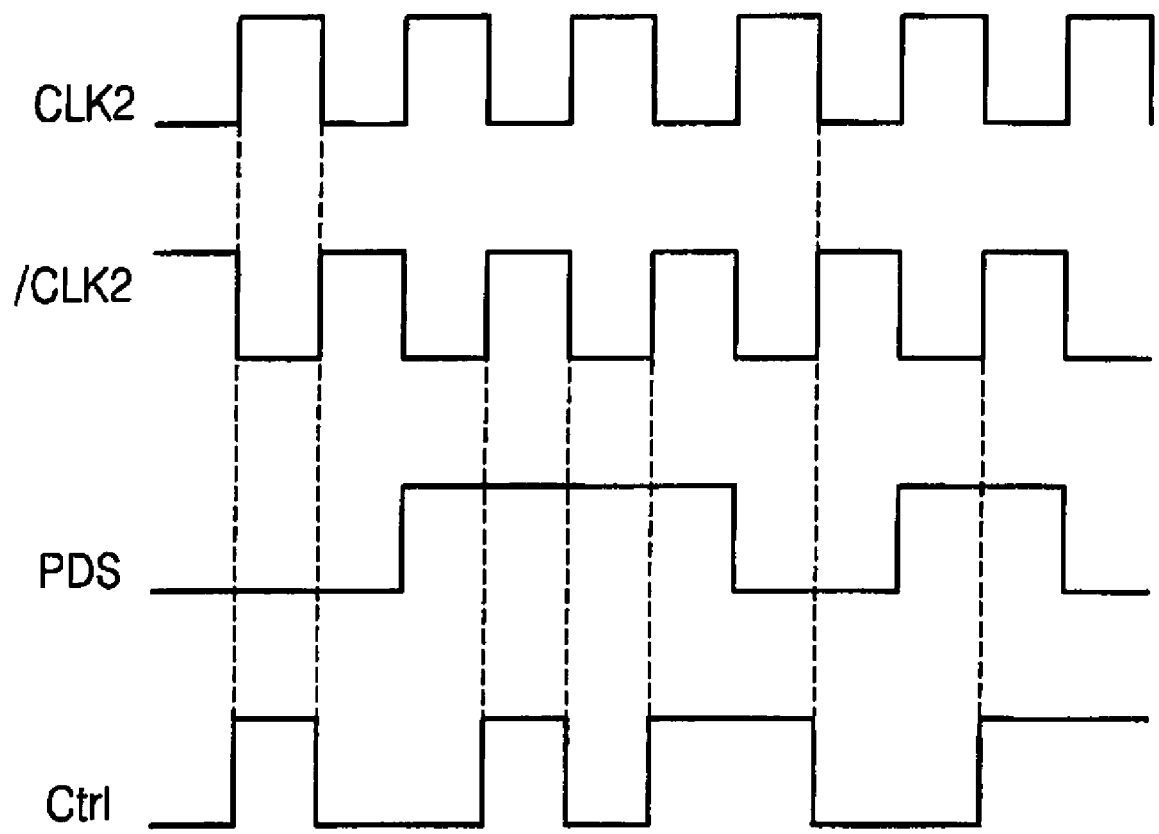
FIG. 8 is a timing diagram of a control signal generated by the control signal generator illustrated in FIG. 6 and a position designating signal.

FIG. 8 is a timing diagram of control signal Ctrl generated by control signal generator 720 and position designating signal PDS. The inverted clock signal /CLK2 is supplied to the first input terminal of multiplexer MUX1 and first clock signal CLK2 is supplied to the second input terminal of multiplexer MUX1. The inverted clock signal /CLK2 and first clock signal CLK2 have a phase difference of 180°. When position designating signal PDS is "01101", first multiplexer MUX1 outputs inverted clock signal /CLK2 when the position designating signal PDS is logic high "H" and outputs first clock signal CLK2 when position designating signal PDS is logic low "L", such that control signal Ctrl is generated as illustrated in FIG. 8.

Figure 9:
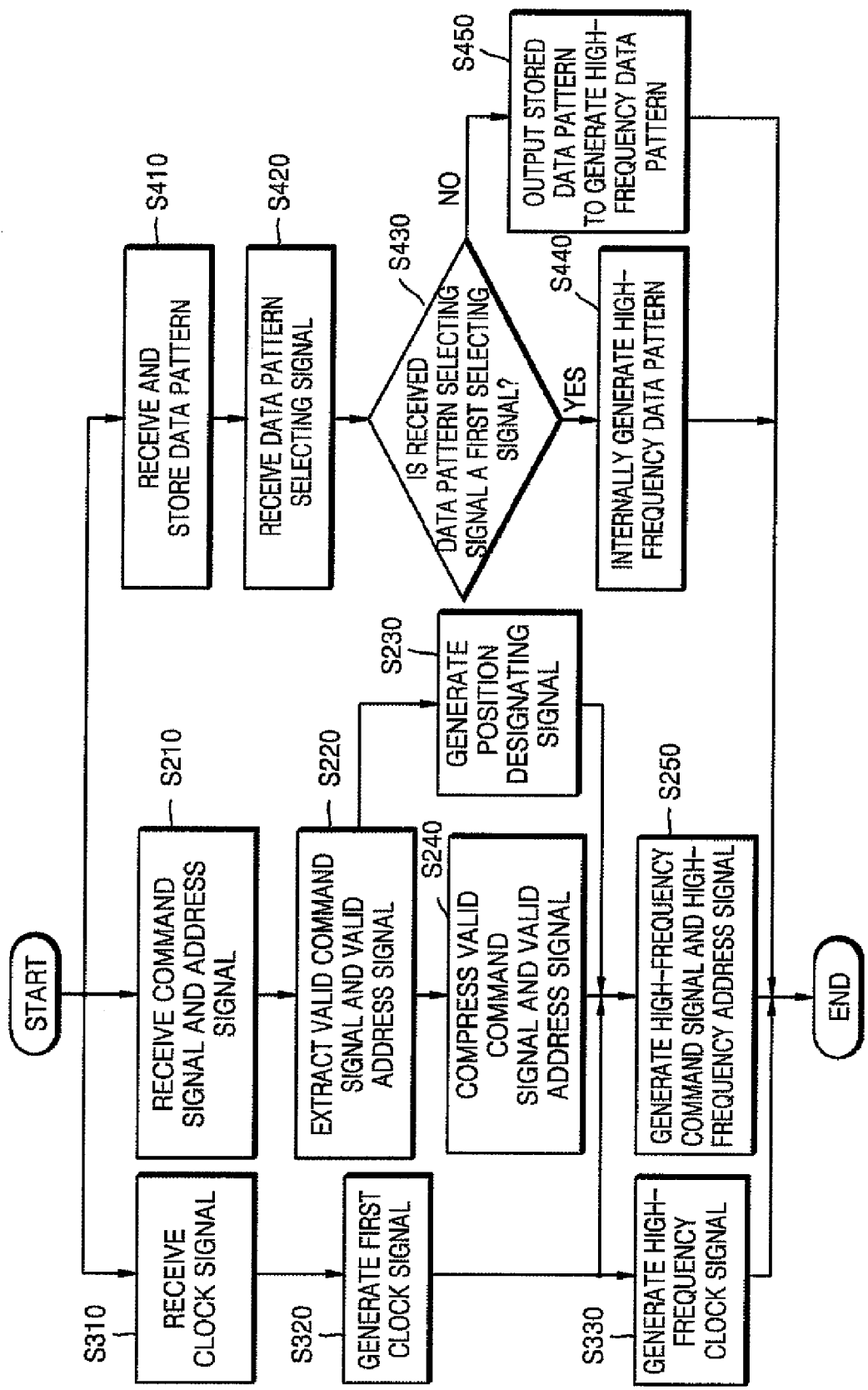
FIG. 9 is a flow chart of a method of generating a high-frequency test pattern according to an embodiment of the present invention.

FIG. 9 is a flow chart of a method of generating a high-frequency test pattern where a command signal and an address signal are grouped at predetermined intervals in step S210. In step S220, a valid command signal and a valid address signal, which are not in an idle state, are respectively extracted from each command signal group and each address signal group. The extracted valid command signal and the extracted valid address signal are compressed into signals having a predetermined length in step S240. A position designating signal indicating the positions of the valid command signal and the valid address signal in each command signal group and each address signal group is generated in step S230. In step S250, an invalid command signal and an invalid address signal are restored using the position designating signal to generate a high-frequency command signal and a high-frequency address signal.

In step S310, a clock signal is received from the ATE and a first clock signal is generated at step S320. The first clock signal from step S320 is used to execute step S250. The high-frequency clock signal is generated using the first clock signal in step S330 which will be used to test a semiconductor memory device. A predetermined data pattern is received from the ATE and stored in step S410. A data pattern selecting signal is received in step S420 and in step S430 a determination is made whether the received data pattern selecting signal is a first selecting signal. The first selecting signal instructs the semiconductor memory device to internally generate a high-frequency data pattern in step S440. When the received data pattern selecting signal is not the first selecting signal, the stored data pattern is output in synchronization with an internal clock signal to generate the high-frequency data pattern in step S450.

Figure 10:
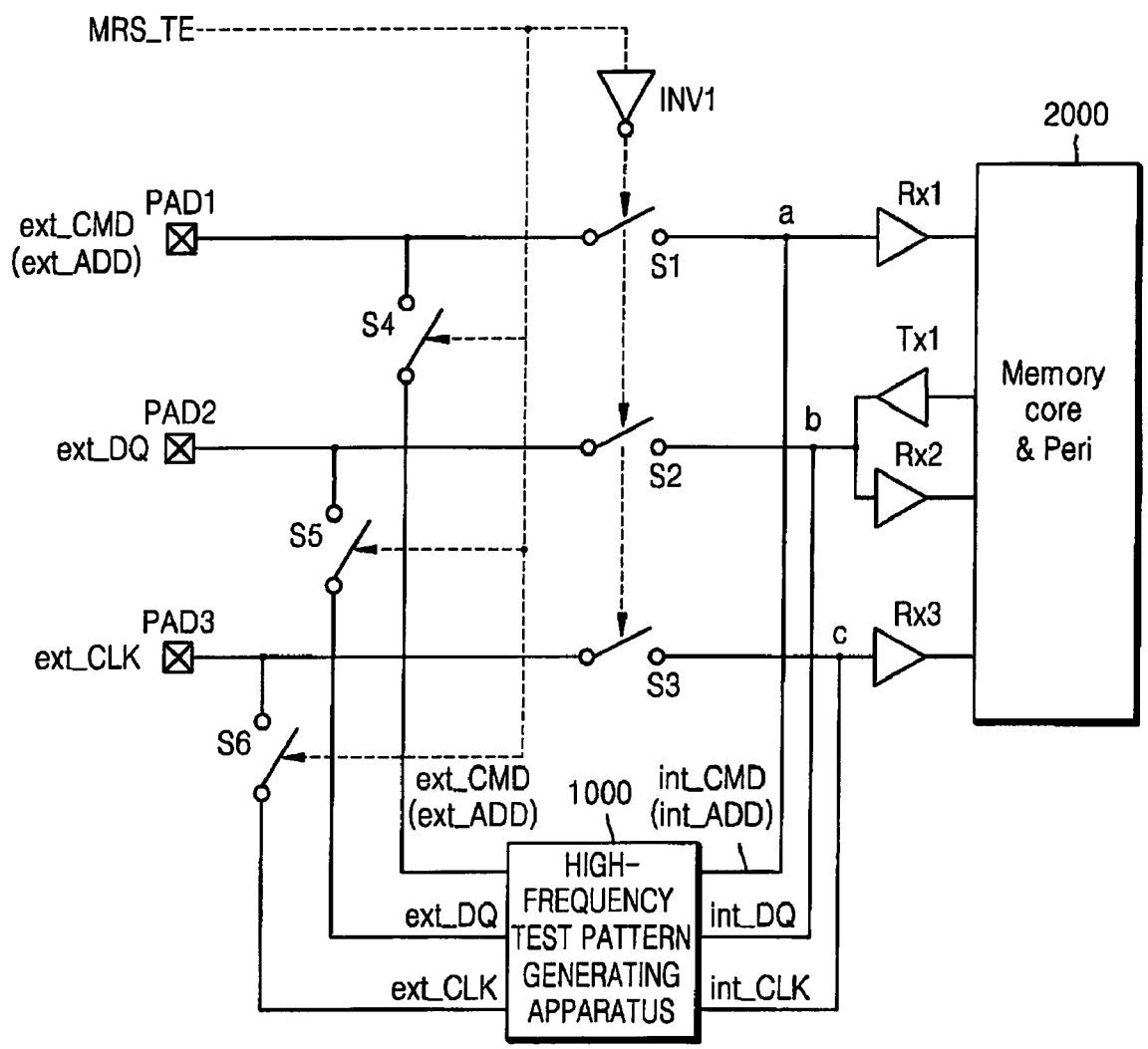
FIG. 10 illustrates an apparatus for generating a high-frequency test pattern according to an embodiment of the present invention.

FIG. 10 illustrates a high-frequency test pattern generating apparatus 1000 located in a semiconductor memory device and electrically connected to first, second and third input/output pads PAD1, PAD2 and PAD3 and first, second and third receiving buffers Rx1, Rx2 and Rx3. Command signal ext_CMD, address signal ext_ADD, data signal ext_DQ and clock signal ext_CLK are output from the ATE (not shown) for testing the semiconductor memory device. In a test mode, a test mode enable signal MRS_TE output from a mode register (not shown) is enabled which turns off first, second and third switches S1, S2 and S3 and turns on fourth, fifth and sixth switches S4, S5 and S6. Command signal ext_CMD and the address signal ext_ADD which are input through the first input/output pad PAD1 are supplied to high-frequency test pattern generating apparatus 1000. Data signal ext_DQ, input via second input/output pad PAD2, and clock signal ext_CLK, input through the third input/output pad PAD3, are supplied to high-frequency test pattern generating apparatus 1000. Although FIG. 10 illustrates that the command signal ext_CMD and the address signal ext_ADD are input through the same input/output pad PAD1, command signal ext_CMD and the address signal ext_ADD are compressed in the same manner and may be inputted to the semiconductor memory device through different input/output pads. High-frequency test pattern generating apparatus 1000 converts the received command signal ext_CMD into a high-frequency command signal int_CMD and also converts the address signal ext_ADD into a high-frequency address signal int_ADD. In response, high-frequency test pattern generating apparatus 1000 outputs the high-frequency command signal int_CMD and the high-frequency address signal int_ADD to first receiving buffer Rx1. In addition, the apparatus 1000 respectively converts the received data signal ext_DQ and the clock signal ext_CLK into a high-frequency data signal int_DQ and a high-frequency clock signal int_CLK and outputs these signals to second and third receiving buffers Rx2 and Rx3.

As described above, the high-frequency test pattern generating apparatus 1000 respectively converts the low-frequency command signal, the low-frequency address signal, the low-frequency data signal and the low-frequency clock signal output from the ATE into the high-frequency command signal, the high-frequency address signal, the high-frequency data signal and the high-frequency clock signal. In this manner, it is possible to determine rapidly and correctly whether a high-speed semiconductor memory device is defective or not using a low-speed ATE.

Referring to FIG. 10, first, second and third receiving buffers Rx1, Rx2 and Rx3 are connected to memory core and peri 2000. Memory core and peri 2000 comprise the memory core and related peripheral circuits which are well-known to those of ordinary skill in the art.

Figure 11:
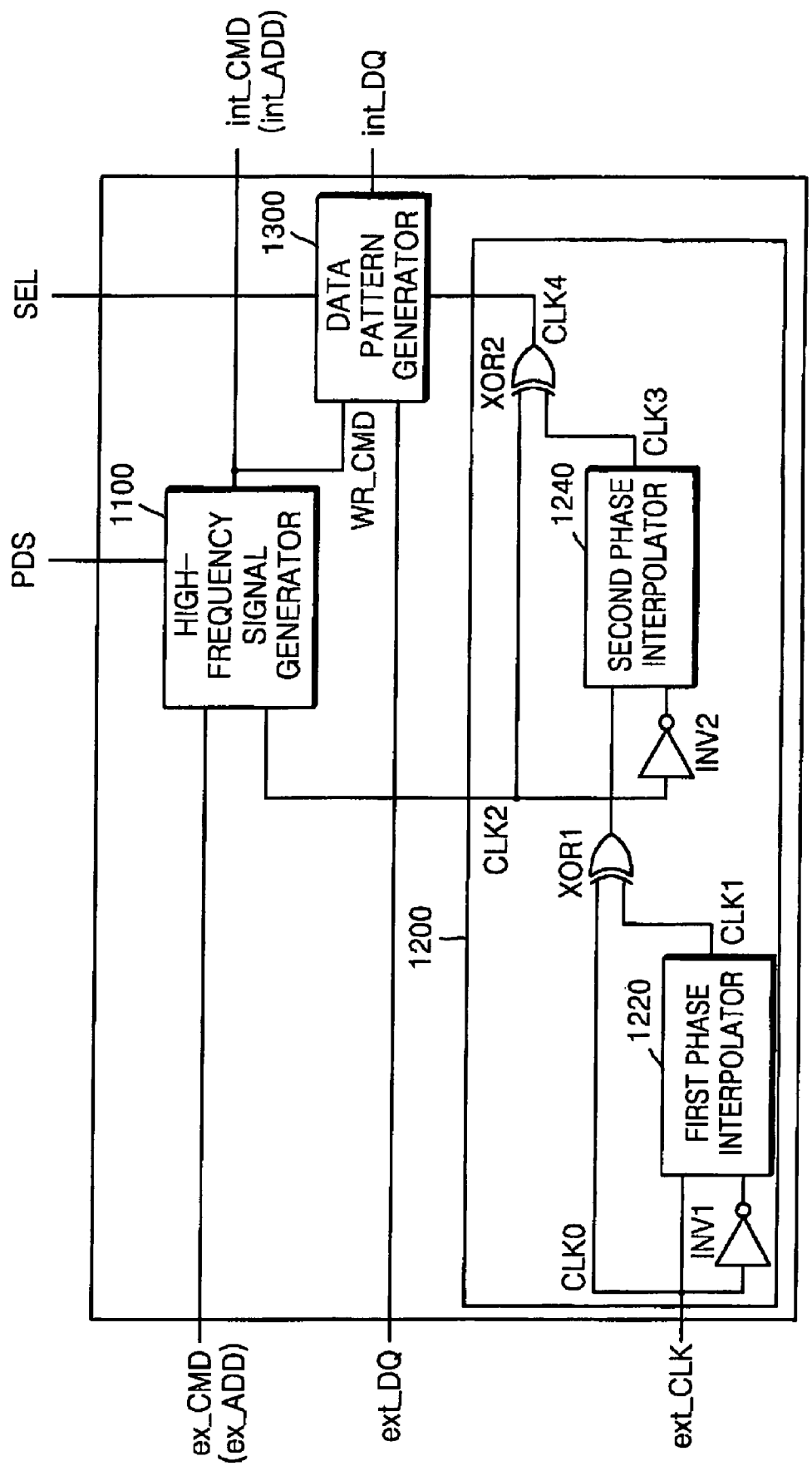
FIG. 11 illustrates a configuration of the high-frequency test pattern generating apparatus illustrated in FIG. 10.

FIG. 11 illustrates a configuration of the high-frequency test pattern generating apparatus 1000 illustrated in FIG. 10 including a high-frequency signal generator 1100, a clock generator 1200 and a data pattern generator 1300. The high-frequency signal generator 1100 receives the command signal ext_CMD, the address signal ext_ADD, the first clock signal CLK2 and the position designating signal PDS and outputs the command signal int_CMD and the address signal int_ADD. Command signal ext_CMD and the address signal ext_ADD may be a compressed valid command signal and a compressed valid address signal. The command signal int_CMD and the address signal int_ADD may be a high-frequency command signal and a high-frequency address signal. Data pattern generator 1300 receives a predetermined data pattern ext_DQ from the ATE (not shown) and stores the received data pattern ext_DQ in a plurality of internal registers (not shown). The data pattern generator 1300 generates a high-frequency data pattern int_DQ by outputting the stored data pattern ext_DQ in synchronization with a high-frequency clock signal CLK4 in response to a write command signal WR_CMD and a data pattern selecting signal SEL.

Clock generator 1200 receives clock signal ext_CLK and multiplies the frequency of clock signal ext_CLK by two to generate first clock signal CLK2. Clock generator 1200 includes first inverter INV1, first phase interpolator 1220, and first exclusive-OR gate XOR1 in order to generate first clock signal CLK2. Furthermore, clock generator 1200 multiplies the frequency of first clock signal CLK2 by two to generate high-frequency clock signal CLK4 corresponding to the internal clock signal of the semiconductor memory device. Clock generator 1200 includes a second inverter INV2, a second phase interpolator 1240 and a second exclusive-OR gate XOR2 to generate high-frequency clock signal CLK4. Clock generator 1200 may include a first delay compensator (not shown) to compensate for a delay due to first phase interpolator 1220 in order to maintain a duty ratio of 50% of first clock signal CLK2. The first delay compensator may be located between an input node receiving clock signal ext_CLK and the first exclusive-OR gate XOR1. Clock generator 1200 may include a second delay compensator (not shown) to compensate for a delay caused by second phase interpolator 1240 in order to maintain a duty ratio of 50% of the second clock signal CLK2 at 50%. Second delay compensator may be located between an input node receiving the first clock signal CLK2 and the second exclusive-OR gate XOR2. When a high-frequency clock signal having a duty ratio that is difficult to maintain at 50% even using the first delay compensator and the second delay compensator is required, a phase locked loop (PLL) may be used as clock generator 1200. Although clock generator 1200 multiplies the frequency of the clock signal ext_CLK by four to generate the high-frequency clock signal CLK4 shown in FIG. 11, it will be understood that the frequency of clock signal ext_CLK can be multiplied by eight or sixteen to generate a high-frequency clock signal.

Figure 12:
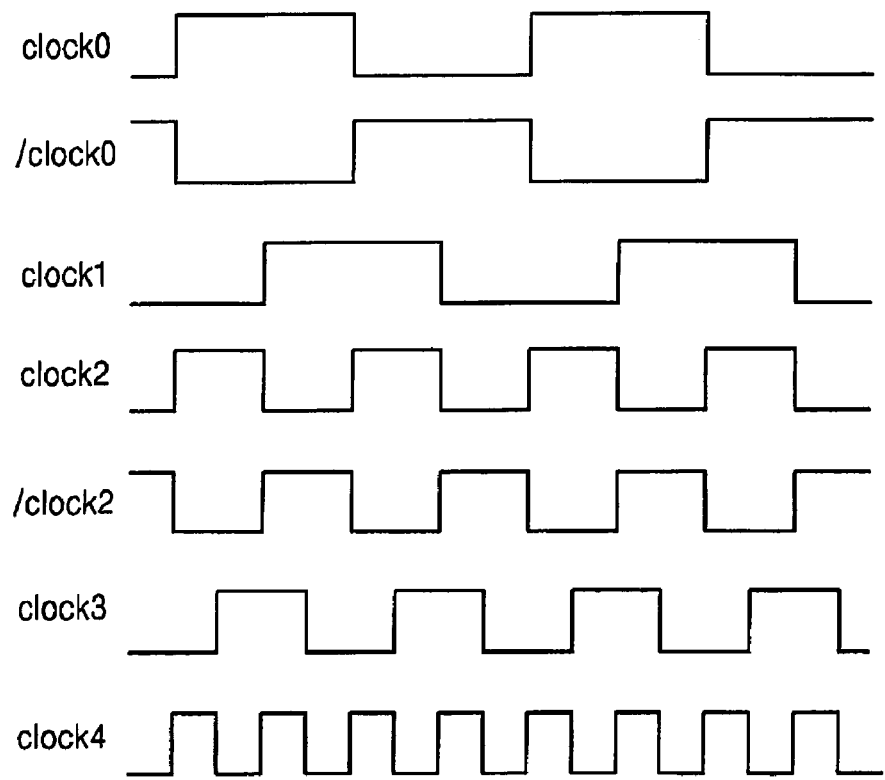
FIG. 12 is a timing diagram illustrating a method of generating a high-frequency clock signal using a low-frequency clock signal supplied from automatic test equipment.

FIG. 12 is a timing diagram illustrating a method of generating a high-frequency clock signal using a low-frequency clock signal supplied from the ATE. The phase of an external clock signal CLK0 is inverted to generate an inverted clock signal /CLK0. The phase of external clock signal CLK0 is shifted by 90° to generate a first shifted clock signal CLK1. An exclusive OR operation is performed on external clock signal CLK0 and first shifted clock signal CLK1 to generate first clock signal CLK2. Inverted clock signal /CLK0 is the basis for generating first shifted clock signal CLK1. Second clock signal CLK4 is generated and is a high-frequency clock signal having the same frequency as the operating frequency of a semiconductor memory device to be tested.

Figure 13:
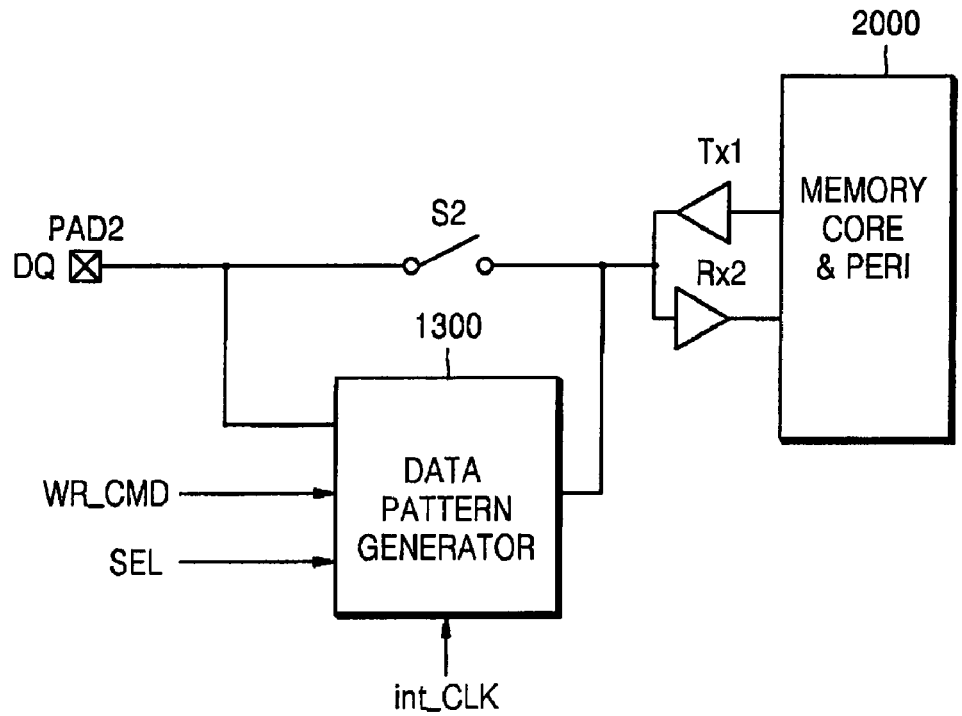
FIG. 13 illustrates a configuration of a data pattern generator illustrated in FIG. 11.

FIG. 13 illustrates a configuration of the data pattern generator 1300 illustrated in FIG. 11 including a built in self test (BIST) circuit. Generator 1300 also includes a first data pattern generator (not shown) which generates a data pattern using a power supply voltage, a ground voltage and a clock signal applied to the semiconductor memory device to be tested. Generator 1300 further includes a second data pattern generator (not shown) that receives a predetermined data pattern from an external device, stores the data pattern DQ in a plurality of registers and outputs the stored data pattern DQ in synchronization with an internal clock signal int_CLK.

Figure 14:
FIG. 14 is a table representing data patterns generated by the data pattern generator illustrated in FIG. 11.
Figure 14:
Figure 14:

FIG. 14 is a table representing the data pattern generated by data pattern generator 1300 illustrated in FIG. 13. The first data pattern generator generates a predetermined data pattern in response to the data pattern selecting signal SEL. The length of the data pattern depends on the burst length of the data pattern. For example, the data pattern 0000, 1111, 1010 and 0101 can easily be generated using a latch circuit through simple metal routing. The first data pattern generator generates a predetermined data pattern in a simple form which is frequently used to test a semiconductor memory device. The second data pattern generator receives a predetermined data pattern output from the ATE in synchronization with a low-frequency clock signal, stores the received data pattern in a predetermined register, and generates a high-frequency data pattern by outputting the stored data pattern in synchronization with a high-frequency clock signal. When the semiconductor memory device enters a test mode after the second data pattern generator stores the data pattern in the predetermined register, a data input pin can be used as a control pin for receiving a control signal such as position designating signal PDS or the data pattern selecting signal SEL. The second data pattern generator generates the data pattern in various forms at the request of a user.

Referring to FIG. 13, second receiving buffer Rx2 is connected to the memory core and peri 2000. As noted above, memory core and peri 2000 comprise the memory core and related peripheral circuits which are well-known to those of ordinary skill in the art.

As described above, the method and system for generating a high-frequency command signal and a high-frequency address signal according to the present invention can test a high-speed semiconductor memory device using low-speed test equipment to improve the usefulness of the test equipment and reduce the time required to test the semiconductor memory device. Furthermore, the method and apparatus for generating a high-frequency test signal can internally generate a high speed data pattern in a semiconductor memory device to be tested and transmit the high-frequency data pattern to a memory region to reduce data pattern loading time. Moreover, the high-frequency test signal generating apparatus has a simple configuration which reduces chip area of the semiconductor memory device.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method of generating a high-frequency command signal and a high-frequency address signal, comprising:
   grouping a command signal into a command signal group;
   grouping an address signal into an address signal group, each of said command signal and said address signal corresponding to L cycles of a clock signal output from an automatic test equipment (ATE) used to test a semiconductor memory device where L is a natural number greater than 1;
   extracting a valid command signal and a valid address signal, each of which are not in an idle state, from each of said command signal groups and each of said address signal groups;
   compressing the valid command signal and the valid address signal into signals having a length corresponding to 1/M of a cycle of the clock signal where M is a natural number larger than 1;
   generating a position designating signal indicating the positions of the valid command signal and the valid address signal in each command signal group and each address signal group, respectively; and
   generating the high-frequency command signal from the compressed valid command signal and the high-frequency address signal from the compressed valid address signal using the position designating signal.

2. The method of claim 1, wherein the generating of the high-frequency command signal and the high-frequency address signal restores an invalid command signal in each command signal group and an invalid address signal in each address signal group to their original positions.

3. The method of claim 1, wherein L is 2 and each of the command signal groups includes at least one invalid command signal in the idle state.

4. The method of claim 1, wherein the grouping of the command signal and the address signal, the extracting of the valid command signal and the valid address signal and the generating of the position designating signal are carried out in the ATE, and the generating of the high-frequency command signal and the high-frequency address signal is performed in the semiconductor memory device.

5. The method of claim 1, wherein the generating of the high-frequency command signal and the high-frequency address signal generates the high-frequency command signal and the high-frequency address signal using the position designating signal and a first clock signal having a frequency of N times that of the clock signal where N is a natural number larger than 1.

6. The method of claim 5, wherein the generating of the high-frequency command signal and the high-frequency address signal comprises:
   receiving the position designating signal and the first clock signal and selectively outputting the first clock signal in response to the logic state of the position designating signal to generate a control signal; and
   in response to the control signal, generating the high-frequency command signal from the compressed valid command signal and the high-frequency address signal from the compressed valid address signal.

7. A method of generating a high-frequency test pattern to test a semiconductor memory device comprising:
   grouping a command signal into command signal groups;
   grouping an address signal into address signal groups, each of said signals corresponding to L cycles of a clock signal output from automatic test equipment (ATE) where L is a natural number greater than 1;
   respectively extracting a valid command signal and a valid address signal, which are not in an idle state, from each of the command signal groups and each of the address signal groups;
   compressing the valid command signal and the valid address signal into signals having a length corresponding to 1/M of a cycle of the clock signal, where M is a natural number larger than 1;
   generating a position designating signal indicating the positions of the valid command signal and the valid address signal in each command signal group and each address signal group, respectively;
   generating a high-frequency command signal and a high-frequency address signal from the compressed valid command signal and the compressed valid address signal, respectively using the position designating signal;
   receiving the clock signal and multiplying the frequency of the received clock signal by N to generate a high-frequency clock signal having the same frequency as that of an internal clock signal used in the semiconductor memory device; and
   receiving a predetermined data pattern selecting signal;
   generating a data pattern corresponding to the predetermined data pattern selecting signal in the semiconductor memory device; and outputting the data pattern in synchronization with the high-frequency clock signal to generate a high-frequency data pattern.

8. The method of claim 7, wherein the generating of the high-frequency command signal and the high-frequency address signal restores an invalid command signal in each command signal group and an invalid address signal in each address signal group to their original positions.

9. The method of claim 8, further comprising:
receiving a predetermined data pattern for testing the semiconductor memory device in synchronization with the clock signal; and
outputting the received predetermined data pattern in synchronization with the high-frequency clock signal to generate the high-frequency data pattern.

10. The method of claim 7, wherein the data pattern corresponding to the predetermined data pattern selecting signal is generated using at least one of a power supply voltage, a ground voltage and a clock signal of the semiconductor memory device.

11. A system for generating a high-frequency command signal and a high-frequency address signal used to test a semiconductor memory device comprising:
a compressing unit configured to group a command signal and an address signal into command signal groups and address signal groups each corresponding to L cycles of a clock signal output from automatic test equipment (ATE) where L is a natural number greater than 1, said compressing unit respectively extracting a valid command signal and a valid address signal, which are not in an idle state, from each of the command signal groups and each of the address signal groups, said compressing unit further compressing the valid command signal and the valid address signal into signals having a length corresponding to 1/M of a cycle of the clock signal where M is a natural number larger than 1;
a position designating signal generator connected to said compressing unit and generating a position designating signal indicating the positions of the valid command signal and the valid address signal in each command signal group and each address signal group; and
a high-frequency signal generator connected to said compressing unit and said position designating signal generator, said high-frequency signal generator respectively generating the high-frequency command signal and a high-frequency address signal from the compressed valid command signal and the compressed valid address signal using the position designating signal.

12. The system of claim 11, wherein the high-frequency signal generator restores an invalid command signal in each command signal group and an invalid address signal in each address signal group to their original positions.

13. The system of claim 11, wherein L is 2 and each of the command signal groups includes at least one invalid command signal in the idle state.

14. The system of claim 11, wherein the compressing unit and the position designating signal generator are located in the ATE and the high-frequency signal generator is located in the semiconductor memory device.

15. The system of claim 11, wherein the high-frequency signal generator comprises:
a control signal generator receiving the position designating signal and a first clock signal having a frequency of N times that of the clock signal where N is a natural number larger than 1, said control signal generator configured to selectively output the first clock signal in response to the logic state of the position designating signal to generate a control signal; and
a multiplexing unit connected to said control signal generator, said multiplexing unit configured to selectively output the compressed valid command signal and the compressed valid address signal to generate the high-frequency command signal and the high-frequency address signal.

16. An apparatus for receiving a test pattern from an ATE for testing a semiconductor memory device and generating a high-frequency test pattern for testing the semiconductor memory device at a high speed, the apparatus comprising:
a high-frequency signal generator configured to receive a command signal and an address signal included in the test pattern and respectively generating a high-frequency command signal and a high-frequency address signal from the command signal and the address signal;
a clock generator coupled to said high frequency signal generator configured to receive a clock signal included in the test pattern and multiplying the frequency of the clock signal by N to generate a high-frequency clock signal having the same frequency as that of an internal clock signal used in the semiconductor memory device; and
a first data pattern generator coupled to said clock generator, said first data pattern generator configured to receive a predetermined data pattern selecting signal in said semiconductor memory device, internally generating a data pattern corresponding to the predetermined data pattern selecting signal in the semiconductor memory device, and generating a high-frequency data pattern by outputting the data pattern in synchronization with the high-frequency clock signal.

17. The apparatus of claim 16, wherein the first data pattern generator generates the data pattern corresponding to the predetermined data pattern selecting signal using at least one of a power supply voltage, a ground voltage and a clock signal of the semiconductor memory device.

18. The apparatus of claim 16, further comprising a second data pattern generator coupled to said clock generator, said second data pattern generator configured to receive a data pattern included in the test pattern in synchronization with the clock signal and outputting the data pattern in synchronization with the high-frequency clock signal to generate the high-frequency data pattern.

19. The apparatus of claim 18, wherein the apparatus is electrically connected between input/output pads of the semiconductor memory device and receiving input buffers of the semiconductor memory device.

20. The apparatus of claim 16, wherein said high frequency signal generator is further configured to group the command signal and the address signal into command signal groups and address signal groups each corresponding to N cycles of a clock signal output from the ATE where N is a natural number larger than 1, and respectively extracting a valid command signal and a valid address signal, which are not in an idle state, from each of the command signal groups and each of the address signal groups and respectively compressing the valid command signal and the valid address signal into signals having a length corresponding to 1/M of a cycle of the clock signal, said high-frequency signal generator receives a position designating signal indicating the positions of the valid command signal and the valid address signal in each command signal group and each address signal group, respectively, in order to generate the high-frequency command signal and the high-frequency address signal from the compressed valid command signal and the compressed valid address signal.

21. The apparatus of claim 20, wherein the clock generator multiplies the frequency of the received clock signal by X to generate a first clock signal where X is a natural number larger than 1, said clock generator configured to output the first clock signal to the high-frequency signal generator and multiply the frequency of the first clock signal by Y to generate the high-frequency clock signal where Y is a natural number larger than 1, said clock generator outputting the high-frequency clock signal to the first data pattern generator.

22. The apparatus of claim 21, wherein the high-frequency signal generator comprises:

a control signal generator receiving the first clock signal and the position designating signal and selectively outputting the first clock signal in response to the logic state of the position designating signal to generate a predetermined control signal; and a multiplexing unit connected to said control signal generator, said multiplexing unit configured to selectively output the compressed valid command signal and the compressed valid address signal in response to the predetermined control signal to generate the high-frequency command signal and the high-frequency address signal.

23. The apparatus of claim 16, wherein the apparatus receives the test pattern in response to a test mode enable signal stored in a mode register.

24. The apparatus of claim 16, wherein the semiconductor memory device receives and outputs data in a DDR mode.

25. The apparatus of claim 16, wherein the clock generator is a PLL.

* * * * *